United States Patent
Bill et al.

(10) Patent No.: US 6,359,824 B1
(45) Date of Patent: Mar. 19, 2002

(54) ACTIVATION OF WORDLINE DECODERS TO TRANSFER A HIGH VOLTAGE SUPPLY

(75) Inventors: Colin S. Bill, Cupertino; Jonathan Shi-Chang Su, Mountain View; Feng Pan, Richmond, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/592,474

(22) Filed: Jun. 9, 2000

Related U.S. Application Data

(60) Provisional application No. 60/182,943, filed on Feb. 15, 2000.

(51) Int. Cl.[7] .................................................. G11C 8/00
(52) U.S. Cl. ...................................... 365/226; 365/201
(58) Field of Search ................................... 365/201, 226

(56) References Cited

U.S. PATENT DOCUMENTS 6,111,801 A * 8/2000 Brady ........................ 365/201

FOREIGN PATENT DOCUMENTS

JP              0003221    *  1/1986    ............. G06F/1/00

OTHER PUBLICATIONS

Betty Prince, "Semiconductor Memories", 1983, 2nd Edition, pp. 501–502.*

* cited by examiner

*Primary Examiner*—David Nelms
*Assistant Examiner*—M. Tran

(57) ABSTRACT

The present invention discloses a method and system for activating a plurality of wordline decoder circuits to transfer a predetermined high voltage to a plurality of wordlines during a test mode in a memory device. A plurality of wordline voltage supply circuits supply voltage for the wordlines. During operation, when the memory device is placed in a test mode requiring application of the predetermined high voltage to the wordlines, the wordline decoder circuits are activated. In addition, a first predetermined voltage that is approximately zero volts is supplied by the wordline voltage supply circuits to the wordline decoder circuits for a first predetermined amount of time. Once the wordline decoder circuits decode the respective wordlines, the first predetermined voltage is transferred to the respective wordlines. The wordline voltage supply circuits then supply a second predetermined voltage that is transferred to the respective wordlines by the still activated wordline decoder circuits for a second predetermined amount of time. Finally, the wordline voltage supply circuits supply a predetermined high voltage that is transferred to the respective wordlines by the still activated wordline decoder circuits for a third predetermined amount of time.

34 Claims, 2 Drawing Sheets

ACTIVATION OF WORDLINE DECODERS TO TRANSFER A HIGH VOLTAGE SUPPLY

RELATED APPLICATIONS

This application claims the benefit under 35 U.S.C. §119 (e) of Provisional U.S. Patent application Serial No. 60/182,943 filed on Feb. 15, 2000 entitled ACTIVATION OF WORDLINE DECODERS TO TRANSFER A HIGH VOLTAGE SUPPLY which is herein incorporated by reference.

FIELD OF INVENTION

The present invention relates generally to non-volatile memory devices and, more particularly, to a method and system of activating a plurality of wordline decoder circuits to transfer a predetermined high voltage to a plurality of wordlines during a test mode in flash electrically erasable programmable read-only memory (EEPROM) devices.

BACKGROUND OF THE INVENTION

Flash memories are popular memory storage devices because they store information in the absence of continuous power and are capable of being constructed in a very compact form Flash memory is typically constructed by fabricating a plurality of floating-gate transistors in a silicon substrate. A floating-gate transistor is capable of storing electrical charge on a separate gate electrode known as a floating gate that is separated by a thin dielectric layer from a control-gate electrode. Generally speaking, data is stored in a non-volatile memory device by the storage of an electrical charge in the floating gate.

Flash memories are in the form of a memory array that includes rows and columns of flash transistors, with each transistor being referred to as a memory cell that includes a control gate, a drain and a source. The control gates of the memory cells in each row of a sector are typically electrically interconnected to form wordlines such that a wordline decoder can direct a plurality of operational voltages to the wordlines. The drains of the memory cells in each column of a sector are typically electrically interconnected to form bitlines such that a bit line decoder directs a plurality of operational voltages to the bitlines. Generally, the sources of the memory cells in a sector are electrically interconnected to form a common sourceline and are controlled by a sourceline controller. As known in the art, the memory array is subdivided into sectors containing rows and columns of memory cells.

In recent years, the density of the memory array on a flash memory has increased dramatically. As the density of the memory array on a flash memory increases, it has become significantly more difficult to produce perfect flash memory. During fabrication of the flash memory, it is common for the memory array to include one or more defective memory cells. In an effort to improve production yield and flash memory reliability, it is known in the art to include spare or redundant memory cells on the flash memory to allow for repair by replacing the defective memory cells in the memory array.

During the fabrication process, the flash memory is tested using different screening techniques to identify defective cells that need replacement. Some of these testing techniques are designed to identify defects in the memory cells that otherwise would only gradually show themselves as the memory cells are operated within the operating specifications of the flash memory. Testing is also performed to verify that accessing parts of the memory array does not affect any other parts of the memory array. The testing is typically initiated by entering a test mode within the flash memory. When a particular test mode is entered, different voltages are applied to the bitline decoder, the wordline decoder and the sourceline controller depending on the testing that will be performed during the test mode.

The prior art methods and systems of performing testing that involve placing a predetermined high voltage on the wordlines in the flash memory have a known problem involving activating the wordline decoder to decode the wordlines to receive the predetermined high voltage. The wordline decoder is activated to transfer the predetermined high voltage to a respective plurality of wordlines when a pull-down transistor within the wordline decoder is activated to pull down an internal node within a respective plurality of wordline decoder circuits to approximately zero volts.

In the prior art, since the predetermined high voltage that needs to be transferred to the respective wordlines by the wordline decoder is first applied to the internal node of the respective wordline decoder circuits, the wordline decoder pull-down transistor must be capable of conducting a high current to a ground connection. To perform this function, the pull-down transistor must be made large thereby taking up area on the flash memory. In addition, as the number of respective wordlines required by the test mode to receive the predetermined high voltage increases, the transfer transistor needs to be made larger to accommodate the higher total current provided from the greater number of internal nodes of the respective wordline decoder circuits.

To that end, a need exists for a memory device with a method and system of applying a predetermined high voltage to a plurality of wordlines during a test mode that does not create high current when the wordline decoder is activated to transfer the predetermined high voltage to the wordlines.

SUMMARY OF THE INVENTION

The present invention discloses a method and system for applying a predetermined high voltage to a plurality of wordlines during a test mode that overcomes the problems associated with the prior art. The preferred flash memory includes a state machine, at least one wordline voltage supply circuit, at least one wordline decoder circuit and a plurality of wordlines. The state machine is electrically connected with the wordline voltage supply circuit and the wordline decoder circuits. The wordline decoder circuits are electrically connected with the wordline voltage supply circuits and the wordlines.

When a test mode is entered that requires a predetermined high voltage on a respective plurality of wordlines, the state machine activates the wordline voltage supply circuit and a plurality of wordline decoder circuits. In the preferred embodiment of the present invention, all of the wordlines in the flash memory are decoded during the test mode to receive the predetermined high voltage and, therefore, all the wordline decoder circuits are activated by the state machine. As known in the art, the state machine is used to control the overall operation of the flash memory in response to instruction sets that are received by the state machine. For purposes of the present invention, it is only necessary for those skilled in the art to understand that the state machine responds to test mode instruction sets to activate the wordline voltage supply circuit and the wordline decoder circuits.

During operation, when the state machine receives test mode instruction sets, the state machine sends electric signals to the wordline voltage supply circuit and the wordline decoder circuits. The electric signals from the state machine activate the wordline voltage supply circuit to begin supplying a first predetermined voltage to the wordline decoder circuits. The first predetermined voltage is from a supply-voltage (Vss) that is approximately zero volts. In addition, electric signals from the state machine activate the wordline decoder circuits to begin decoding the wordlines. As each respective wordline decoder circuit decodes respective wordlines, the first predetermined voltage supplied from respective wordline voltage supply circuits is transferred to the respective wordlines by the respective wordline decoder circuit.

As part of the activation by the state machine of the plurality of wordline decoder circuits, the state machine also activates a pull-down transistor that provides an electrical connection with a ground connection for the wordline decoder circuits. When the state machine activates a particular wordline decoder circuit, an internal node within the wordline decoder circuit is electrically connected through the pull-down transistor to the ground connection and is pulled down to zero volts. The internal node within the particular wordline decoder circuit is also electrically connected with the voltage provided by a respective wordline voltage supply circuit. Since at the time the particular wordline decoder circuit is activated, the first predetermined voltage supplied by the respective wordline voltage supply circuit is approximately zero volts, a negligible amount of current flows on the internal node through the pull-down transistor to the ground connection.

In the preferred embodiment, when the wordline decoder circuits have completed decoding the wordlines, the wordline voltage supply circuit begins supplying a second predetermined voltage to the activated wordline decoder circuits. The second predetermined voltage is from a supply voltage (Vcc) that is approximately 3.3 V. The wordline decoder circuits transfer the second predetermined voltage to the previously decoded wordlines. When the second predetermined voltage is supplied to the wordline decoder circuits, the internal node of each of the wordline decoder circuits is electrically isolated from the voltage being supplied by the wordline voltage supply circuits.

After the second predetermined voltage has been supplied to the wordline decoder circuits for at least ten microseconds, the state machine receives instruction sets and activates the wordline voltage supply circuit to supply a predetermined high voltage, which is at least 7 V in the preferred embodiment. The wordline voltage supply circuit that generates the predetermined high voltage is an external high voltage supply in the preferred embodiment Since the internal node of the activated wordline decoder circuits is electrically isolated from the predetermined voltage and the respective wordlines were previously decoded, the wordlines are already selected to receive voltage from the wordline voltage supply circuit. As such, the predetermined high voltage supplied by the wordline voltage supply circuit is transferred to the wordlines by the activated wordline decoder circuits and raises the wordlines to the predetermined high voltage.

At the conclusion of the test mode, the state machine receives instruction sets and activates the wordline voltage supply circuit to discontinue supplying the predetermined high voltage and again start supplying the second predetermined voltage. Since the wordlines have remained decoded by the activated wordline decoder circuits, the second predetermined voltage is transferred to the wordlines thereby reducing the magnitude of voltage on the wordlines from the predetermined high voltage. After the wordline decoder circuits have transferred the second predetermined voltage for at least ten microseconds, the wordline voltage supply circuit is activated to supply the first predetermined voltage and the wordline decoder circuits are deactivated to stop decoding the respective wordlines and exit the test mode.

These and other features and advantages of the invention will become apparent upon consideration of the following detailed description of the presently preferred embodiments of the invention, viewed in conjunction with the appended drawings.

DETAILED DESCRIPTION OF THE INVENTION

The exemplary embodiments of the invention are set forth below with reference to specific configurations, and those skilled in the art would recognize that various changes and modifications could be made on the specific configurations while remaining within the scope of the claims. The invention may be used with any type of memory device; however, the preferred embodiment of the present invention is designed for a flash memory.

All electrical parameters are given by example only and can be modified to be used with various memory devices using other electrical parameters. For example, in the preferred embodiment, a supply voltage (Vcc) is considered as nominally 3.3 V, but could alternatively be 5 V, 1.8 V or some other supply voltage. If a different supply voltage (Vcc) is chosen, the various operational levels would be modified to accommodate the different supply voltage, as known in the art.

Figure 1:
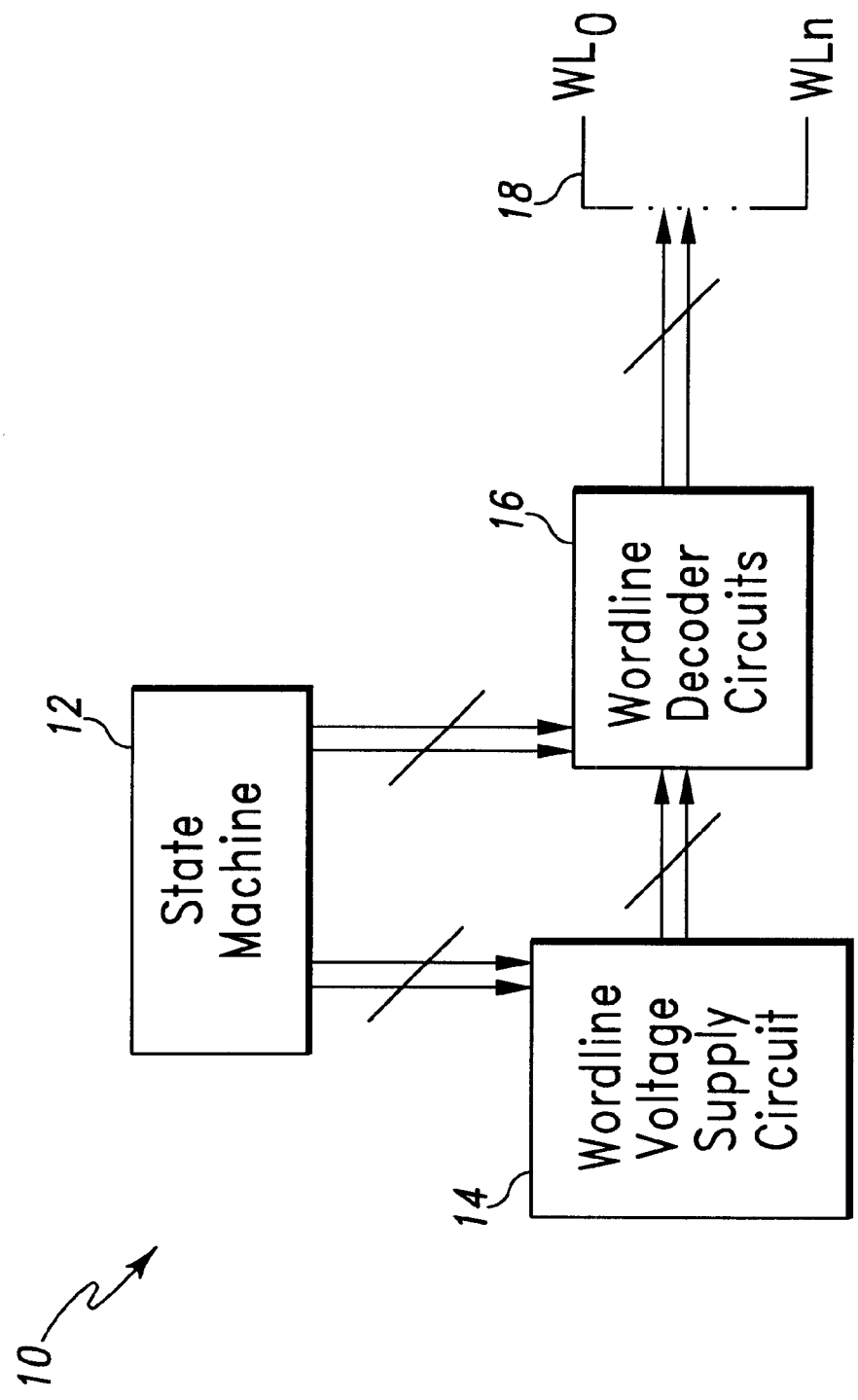
FIG. 1 represents a block diagram of a portion of a preferred flash memory incorporating a preferred embodiment of the present invention.

FIG. 1 illustrates a block diagram of a portion of a flash memory 10 incorporating an embodiment of the present invention The preferred flash memory 10 includes a state machine 12, at least one wordline voltage supply circuit 14, at least one wordline decoder circuit 16 and a plurality of wordlines 18. The state machine 12 is electrically connected with the wordline voltage supply circuit 14 and the wordline decoder circuits 16. The wordline voltage supply circuit 14 is electrically connected with the wordline decoder circuits 16. The wordline decoder circuits 16 are electrically connected with the wordlines 18.

During operation, when the preferred flash memory 10 enters a test mode that requires a predetermined high voltage to be applied to the wordlines 18, the wordline voltage supply circuit 14 and the wordline decoder circuits 16 are activated by the state machine 12. Once activated, the wordline voltage supply circuit 14 generates and supplies a first predetermined voltage of approximately zero volts to the wordline decoder circuits 16. The wordline decoders circuits 16 are then activated to decode preselected wordlines 18 and transfer the first predetermined voltage to the decoded wordlines 18. An internal node (not shown in FIG. 1) in the wordline decoder circuits 16 receives the first predetermined voltage supplied by the wordline voltage supply circuit 14 to activate the wordline decoder circuits 16. Since the first predetermined voltage is approximately zero volts, activation of the wordline decoder circuits 16 is accomplished with minimal current flow through the internal node of the wordline decoder circuits 16 to a ground connection (not shown in FIG. 1) within the flash memory 10.

Once all the wordlines 18 are decoded, the wordline voltage supply circuit 14 is activated by signals from the state machine 12 to supply a second predetermined voltage of approximately 3.3 V to the wordline decoder circuits 16. The second predetermined voltage causes the internal node of the wordline decoder circuits 16 to be electrically isolated from the second predetermined voltage that is being supplied by the wordline voltage supply circuit 14. The electrical isolation maintains minimal current flow on the internal node and allows the wordline decoder circuits 16 to remain activated. During operation, the wordlines 18 remain decoded and the activated wordline decoder circuits 16 transfer the second predetermined voltage to the wordlines 18.

After a period of at least ten microseconds, the wordline voltage supply circuit 14 is activated to supply a predetermined high voltage of at least 7 V to the wordline decoder circuits 16. The wordline decoder circuits 16 remain activated since the internal node in each wordline decoder circuit 16 is electrically isolated from the predetermined high voltage such that current through the internal node is minimal. The wordlines 18 remain decoded and the predetermined high voltage is transferred to the wordlines 18 by the wordline decoder circuits 16 for at least ten microseconds. The period of time that the predetermined high voltage may be transferred to the wordlines 18 is not limited by a maximum duration.

At the conclusion of the test mode, the state machine 12 causes the wordline voltage supply circuit 14 to discontinue supplying the predetermined high voltage and to once again begin supplying the second predetermined voltage. Since the wordlines 18 have remained decoded by the activated wordline decoder circuits 16, the second predetermined voltage is transferred to the wordlines 18, thereby reducing the magnitude of voltage on the wordlines 18 from the predetermined high voltage to the second predetermined voltage. After the second predetermined voltage has been transferred by the wordline decoder circuits 16 for at least ten microseconds, the wordline voltage supply circuit 14 is then directed by the state machine 12 to supply the first predetermined voltage to the wordlines 18. The wordline decoder circuits 16 are then deactivated by the state machine 12 to stop decoding the wordlines 18 and exit the test mode.

As known in the art, the state machine 12 is used to control the overall operation of the flash memory 10 in response to instruction sets that are received by the state machine 12. For purposes of the present invention, it is only necessary for those skilled in the art to understand that the state machine 12 responds to externally controlled instruction sets that are received during the test mode. The instruction sets are externally controlled by a user and control the wordline voltage supply circuit 14 and the wordline decoder circuits 16 via the state machine 12 during execution of the test mode to apply the predetermined high voltage to the wordlines 18.

In the preferred embodiment of the present invention, all of the wordlines 18 in the flash memory 10 receive the predetermined high voltage during the test mode. The predetermined high voltage is provided to the wordlines 18 within a sector of the flash memory 10 by a respective wordline voltage supply circuit 14 and a respective wordline decoder circuit 16 that are activated by the state machine 12. Those skilled in the art would appreciate that the number of wordlines 18 that receive the predetermined high voltage is dependent on the particular test mode and should therefore not be construed as a limitation of the present invention In addition, those skilled in the art would recognize that the wordline voltage supply circuit 14, the number of wordline decoder circuits 16 and the number of wordlines 18 within the sectors of the flash memory 10 can vary in different embodiments of the present invention.

Figure 2:
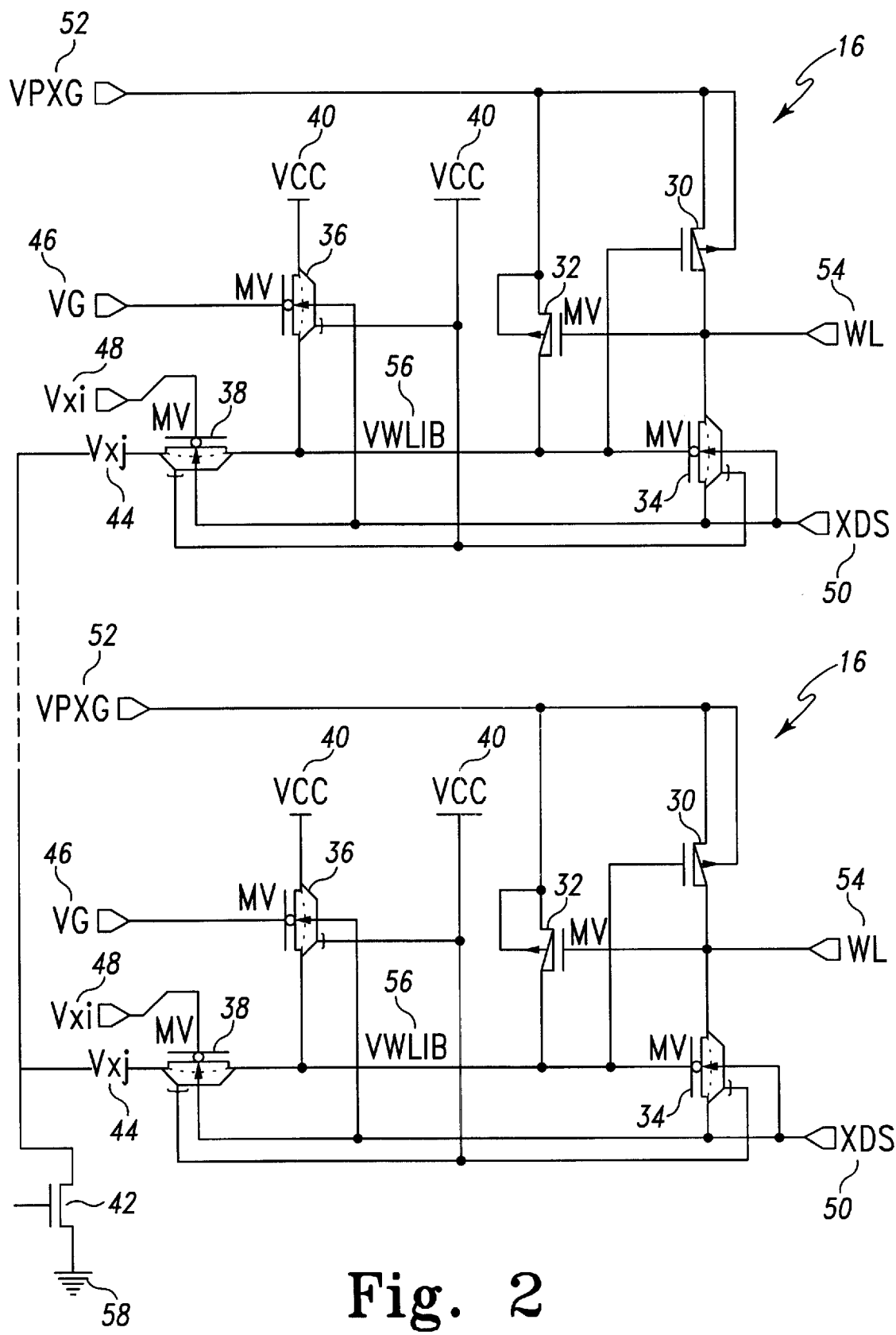
FIG. 2 represents a circuit schematic of the plurality of wordline decoder circuits of the preferred flash memory illustrated in FIG. 1.

FIG. 2 illustrates a circuit schematic of two of the preferred wordline decoder circuits 16 used in the present invention The preferred wordline decoder circuits 16 comprise a plurality of p-channel enhancement transistors 30, 32, a plurality of low-threshold n-channel transistors 34, 36, 38 and a plurality of supply voltage connections (Vcc) 40 that are electrically connected as illustrated.

In the preferred embodiment of the present invention, an n-channel pull-down transistor 42 is connected, via a pull-down line (Vxj) 44, to each wordline decoder circuit 16 as illustrated in FIG. 2. In particular, the drain of n-channel pull-down transistor 42 is electrically connected to the source of low-threshold n-channel transistor 38. In addition, each of the wordline decoder circuits 16 is controlled by the state machine 12 with a gate voltage control line (VG) 46, an address line (Vxi) 48 and an x-decoder control line (XDS) 50 that are also electrically connected with the wordline decoder circuits 16 as illustrated. The wordline decoder circuits 16 are also electrically connected with the wordline voltage supply circuit 14 by a wordline supply voltage line (VPXG) 52. As further illustrated, the output of the wordline decoder circuits 16 is electrically connected with respective wordlines 18 by a respective wordline voltage line (WL) 54.

In the preferred embodiment, the state machine 12 directs electric signals to each of the wordline decoder circuits 16 with the gate voltage control line (VG) 46 and the address line (Vxi) 48. The address line (Vxi) 48 activates low-threshold n-channel transistor 38 to electrically connect an internal node (VWLIB) 56 with the pull-down line (Vxj) 44. As illustrated in FIG. 2, the pull-down line (Vxj) 44 of each wordline decoder circuit 16 is electrically connected with the drain of the n-channel pull-down transistor 42. The source of the n-channel pull-down transistor 42 is electrically connected with a ground connection 58.

Generally speaking, the x-decoder control line (XDS) 50 and the pull-down line (Vxj) 44 are electrically connected with different voltage sources that are controlled by the state machine 12. The x-decoder control line (XDS) 50 is lowered to approximately zero volts during the test mode where the predetermined high voltage is required on the wordlines 18 and does not directly contribute to raising the wordlines 18 to the predetermined high voltage. The pull-down line (Vxj) 44, for purposes of the present invention, is electrically connected with the drain of low-threshold n-channel transistor 38 and provides an electrical connection to the ground connection 58 during the test mode.

As further illustrated in FIG. 2, the wordline supply voltage line (VPXG) 52 is electrically connected with the source and well of p-channel enhancement transistor 30 and the source and well of p-channel enhancement transistor 32. As previously set forth, the wordline voltage supply circuit 14 supplies the voltage provided on the wordline voltage supply line (VPXG) 52 by generating and supplying different predetermined voltage levels on the wordline voltage supply line (VPXG) 52. The first predetermined voltage is a supply voltage (Vss) of approximately zero volts and the second predetermined voltage is a supply voltage (Vcc) of approximately 3.3 V. In the preferred embodiment, the predetermined high voltage is greater than 7.0 V and is supplied by the wordline voltage supply circuit 14 with an external high voltage supply. For the purpose of the present invention, a detailed discussion of the configuration and operation of the wordline voltage supply circuit 14 is not necessary.

Referring once again to FIG. 1, as previously set forth, the present invention discloses a method and system for activating wordline decoders 16 to transfer a predetermined high voltage to wordlines 18 in flash memory 10. During a test operation, the state machine 12 receives instruction sets indicating that the test mode has been entered that requires the predetermined high voltage to be applied to the wordlines 18. In response to the instruction sets, the state machine 12 generates electric signals that are provided to the wordline voltage supply circuit 14. The signals from the state machine 12 activate the wordline voltage supply circuit 14 to supply the first predetermined voltage to the wordline decoder circuits 16.

Referring once again to FIG. 2, when the test mode is entered, the state machine 12 also activates the wordline decoder circuits 16. The state machine 12 activates n-channel pull-down transistor 42, thereby electrically connecting the pull-down lines (Vxj) 44 of each wordline decoder circuit 16 with the ground connection 58. In addition, a non-conducting electric signal is generated by the state machine 12 on the gate voltage control line (VG) 46 to deactivate low-threshold n-channel transistor 36, thereby electrically isolating the internal node (VWLIB) 56 from the supply voltage (Vcc) connection 40.

The state machine 12 also generates a conducting electric signal on the address line (Vxi) 48 for a particular wordline decoder circuit 16 to activate low-threshold n-channel transistor 38. When low-threshold n-channel transistor 38 is activated, the voltage level of the internal node (VWLIB) 56 in the particular wordline decoder circuit 16 is lowered to approximately zero volts due to the electrical connection with the ground connection 58, thereby activating wordline decoder circuit 16. Once the internal node (VWLIB) 56 is lowered to approximately zero volts, decoding of the respective wordlines 18 by the particular wordline decoder circuit 16 is complete and the wordline decoder circuit 16 will transfer voltage to the wordlines 18.

The first predetermined voltage is supplied by the wordline voltage supply circuit 14 on the wordline supply voltage line (VPXG) 52. When the internal node (VWLIB) 56 is lowered to approximately zero volts, p-channel enhancement transistor 30 is activated to transfer the first predetermined voltage to the wordline voltage line (WL) 54. The wordline voltage line (WL) 54 provides the first predetermined voltage to the respective wordlines 18.

Since the first predetermined voltage is approximately zero volts when the wordline decoder circuits 16 are activated to decode the wordlines 18, the n-channel pull-down transistor 42 is able to pull the internal node (VWLIB) 56 of all the wordline decoder circuits 16 down to approximately zero volts. Those skilled in the art would recognize that p-channel enhancement transistor 32 is initially activated and, if the predetermined high voltage was on the wordline voltage supply line (VPXG) 52, the predetermined high voltage would be applied to the internal node (VWLIB) 56. As known in the art, the n-channel pull-down transistor 42 would need to be rated for large current flow if the predetermined high voltage was applied to the internal node (VWLIB) 56 when the plurality of wordline decoder circuits 16 were activated by the state machine 12. Initiating the test mode with the wordline voltage supply line (VPXG) 52 at 0 V therefore allows activation of all the wordline decoder circuits 16 without significant current flow from the wordline voltage supply line (VPXG) 52.

The state machine uses a timer (not shown) to control the amount of time the wordline voltage supply circuit 14 supplies the first predetermined voltage to the wordline decoder circuits 16. The time required is based on the amount of time required by the wordline decoder circuits 16 to decode the wordlines 18. Those skilled in the art would recognize that a variety of different types of timers known in the art could be used to provide the time delay required and, therefore, a detailed discussion of timers is unnecessary.

After the first time period passes, the wordline voltage supply circuit 14 is activated to begin supplying the second predetermined voltage to maintain the decoding of the respective wordlines 18 by the wordline decoder circuits 16. By supplying the second predetermined voltage to the previously activated wordline decoder circuits 16, p-channel enhancement transistor 32 in the wordline decoder circuits 16 is deactivated, thereby electrically disconnecting the internal node (VWLIB) 56 from the wordline voltage supply line (VPXG) 52. Once p-channel enhancement transistor 32 is deactivated, the internal node (VWLIB) 56 is unaffected by the magnitude of voltage on the wordline voltage supply line (VPXG) 52. As such, the internal node (VWLIB) 56 remains near zero volts with negligible current flow on the pull-down line (Vxj) 44 through n-channel pull-down transistor 42 to the ground connection 58. Those skilled in the art would recognize that the second predetermined voltage is supplied to the activated wordline decoder circuits 16 to avoid corrupting the previous decoding of the wordlines 18 when the predetermined high voltage is subsequently supplied on the wordline voltage supply line (VPXG) 52.

After the second predetermined voltage has been supplied for a second predetermined amount of time, which is at least ten microseconds in the preferred embodiment, the state machine 12 receives instruction sets to start the wordline voltage supply circuit 14 to begin supplying the predetermined high voltage. The ten microsecond time delay avoids the possibility of the wordline voltage supply circuit 14 supplying the predetermined high voltage before p-channel enhancement transistor 32 is completely deactivated. If p-channel enhancement transistor 32 is not completely deactivated, potentially damaging overcurrent through n-channel pull-down transistor 42 may occur that could corrupt the decoding of the wordlines 18.

The wordline voltage supply circuit 14 supplies the predetermined high voltage from the external high voltage supply to the activated wordline decoder circuits 16 on the wordline voltage supply line (VPXG) 52. Since the wordline decoder circuits 16 have previously decoded respective wordlines 18, the wordlines 18 remain selected. The predetermined high voltage is transferred to the selected wordlines 18 on the wordline voltage line (WL) 54 for a third predetermined amount of time of at least ten microseconds. The period of time that the predetermined high voltage may be transferred to the wordlines 18 is not limited by a maximum duration.

Since p-channel enhancement transistor 32 was deactivated when the second predetermined voltage was supplied for at least ten microseconds, the predetermined high voltage does not appear on the internal node (VWLIB) 56 and the wordline decoder circuits 16 remain activated. When the predetermined high voltage is transferred to the wordlines 18, the wordlines 18 are raised to the voltage level of the predetermined high voltage. The process of entering the test mode and raising the wordlines 18 to the predetermined first, second and high voltage must take at least twenty microseconds to complete in order to avoid corrupting the decoding of the wordline decoder circuits 16.

At the conclusion of the test mode, the state machine 12 receives instruction sets indicating that the test mode has concluded. In response to the instruction sets, the state machine 12 sends electric signals to the wordline voltage supply circuit 14. The electric signals from the state machine 12 cause the wordline voltage supply circuit 14 to stop supplying the predetermined high voltage and begin supplying the second predetermined voltage. The second predetermined voltage is supplied to the wordline decoder circuits 16 from the wordline voltage supply circuit 14 on the wordline voltage supply line (VPXG) 52. Since the wordline decoder circuits 16 are still activated, the wordlines 18 remain decoded and the second predetermined voltage is transferred to the wordlines 18 by the wordline decoder circuits 16 on the wordline voltage line (WL) 54.

After a time delay of at least ten microseconds, the voltage on the wordlines 18 has been reduced from the predetermined high voltage to the second predetermined voltage. The state machine 12 then receives a set of instructions to stop decoding the wordlines 18. In response to the instruction sets, the state machine 12 generates electric signals that are directed to the gate voltage control line (VG) 46, the address line (Vxi) 48 and to the n-channel pull-down transistor 42. The respective electric signals from the state machine 12 activate low-threshold n-channel transistor 36 and deactivate transistors 38 and 42, respectively.

When low-threshold n-channel transistor 36 is activated and low-threshold n-channel transistor 38 and n-channel pull-down transistor 42 are deactivated, the internal node (VWLIB) 56 of the respective wordline decoder circuit 16 is raised to the supply voltage (Vcc) 40. The voltage on the wordline voltage supply line (VPXG) 52 is no longer transferred to the wordline voltage line (WL) 54 since p-channel enhancement transistor 30 is deactivated and the wordlines 18 are no longer decoded. Those skilled in the art would recognize that the wordline decoder circuits 16 cannot stop decoding the respective wordlines 18 while the predetermined high voltage is supplied on the wordline voltage supply line (VPXG) 52 without causing p-channel enhancement transistors 30, 32 and low-threshold n-channel transistor 34 to fail to switch.

Due to the sequential application of the predetermined first, second and high voltage supply to the wordline decoder circuits 16, the internal node (VWLIB) 56 of each of the wordline decoder circuits 16 remains at approximately zero volts. As such, when all of the wordlines 18 are selected to receive the predetermined high voltage, the wordline decoder circuits 16 remain activated and transfer the predetermined high voltage to the respective wordlines 18. In addition, since the internal node (VWLIB) 56 of each of the wordline decoder circuits 16 remains at approximately zero volts, the current through n-channel pull-down transistor 42 is minimal when all the wordline decoder circuits 16 are activated.

While the invention has been described in its currently best known modes of operation and embodiments, other modes and embodiments of the invention will be apparent to those skilled in the art and it is the following claims, including all equivalents, that are intended to define the spirit and scope of the invention.

What is claimed is:

1. A method of controlling the voltage applied to a plurality of wordlines in a memory device during test mode, comprising the steps of:

applying a first predetermined voltage that is generated by at least one wordline voltage supply circuit to at least one wordline for a first predetermined amount of time;

applying a second predetermined voltage that is generated by said at least one voltage supply circuit to said wordline for at least ten microseconds; and applying a predetermined high voltage that is generated by said at least one voltage supply circuit to said wordline for a third predetermined amount of time.

2. The method of claim 1 wherein said first predetermined voltage is about zero volts.

3. The method of claim 1 wherein said second predetermined voltage is about 3.3 V.

4. The method of claim 1 wherein said predetermined high voltage is at least 7.0 V.

5. The method of claim 1 wherein said first predetermined amount of time is the amount of time required for said first predetermined voltage to be applied to said at least one wordline.

6. The method of claim 1 wherein said third predetermined amount of time comprises at least ten microseconds.

7. The method of claim 1 wherein said wordline voltage supply circuit for providing said predetermined high voltage comprises an external high voltage supply.

8. A method of transferring a high voltage to wordlines in a memory device during test mode, comprising the steps of generating a first predetermined voltage with at least one wordline voltage supply circuit;

transferring said first predetermined voltage to a plurality of wordlines with at least one wordline decoder circuit for a first predetermined amount of time;

generating a second predetermined voltage with said at least one wordline voltage supply circuit;

transferring said second predetermined voltage to said plurality of wordlines with said at least one wordline decoder circuit for a second predetermined amount of time;

generating a predetermined high voltage with said at least one wordline voltage supply circuit;

transferring said predetermined high voltage to said plurality of wordlines with said at least one wordline decoder circuit for a third predetermined amount of time.

9. The method of claim 8 wherein said first predetermined voltage is about zero volts.

10. The method of claim 8 wherein said second predetermined voltage is about 3.3 V.

11. The method of claim 8 wherein said d predetermined high voltage is at least 7.0 V.

12. The method of claim 8 wherein said first predetermined amount of time is based on the amount of time required for said plurality of wordline decoder circuits to decode said plurality of wordlines.

13. The method of claim 8 wherein said second predetermined amount of time comprises at least ten microseconds.

14. The method of claim 8 wherein said third predetermined amount of time comprises at least ten microseconds.

15. The method of claim 8 wherein said wordline voltage supply circuit that supplies said predetermined high voltage comprises an external high voltage supply.

16. A wordline decoding system to transfer testing voltages to a plurality of wordlines in a memory device, comprising:

a state machine;

at least one wordline voltage supply circuit electrically connected with said state machine, wherein said wordline voltage supply circuit is capable of providing a first predetermined voltage, a second predetermined voltage and a predetermined high voltage;

a plurality of wordline decoder circuits electrically connected with said state machine, said wordline voltage supply circuit and said plurality of wordlines, wherein said state machine sequentially transfers said first predetermined voltage for a first predetermined amount of time to said wordlines using said wordline decoders, said second predetermined voltage for a second predetermined amount of time and said predetermined high voltage for a third predetermined amount of time.

17. The wordline decoding system of claim 16 wherein said first predetermined voltage is about zero volts.

18. The wordline decoding system of claim 16 wherein said second predetermined voltage is about 3.3 V.

19. The wordline decoding system of claim 16 wherein said predetermined high voltage is at least 7.0 V.

20. The wordline decoding system of claim 16 wherein said first predetermined amount of time comprises the amount of time required for said plurality of wordline decoder circuits to decode said plurality of wordlines.

21. The wordline decoding system of claim 16 wherein said second predetermined amount of time is at least ten microseconds.

22. The wordline decoding system of claim 16 wherein said third predetermined amount of time is at least ten microseconds.

23. The wordline decoding system of claim 16 wherein said wordline voltage supply circuit comprises an external high voltage supply for providing said predetermined high voltage.

24. A method of controlling the voltage applied to a plurality of wordlines in a memory device during test mode, comprising the steps of:

applying a first predetermined voltage that is generated by at least one wordline voltage supply circuit to at least one wordline for a first predetermined amount of time;

applying a second predetermined voltage that is generated by said at least one voltage supply circuit to said wordline for a second predetermined amount of time; and applying a predetermined high voltage that is generated by said at least one voltage supply circuit to said wordline for at least ten microseconds.

25. The method of claim 24 wherein said first predetermined voltage is about zero volts.

26. The method of claim 24 wherein said second predetermined voltage is about 3.3 volts.

27. The method of claim 24 wherein said predetermined high voltage is at least 7 volts.

28. The method of claim 24 wherein said first predetermined amount of time is the amount of time required for said first predetermined voltage to be applied to said at least one wordline.

29. The method of claim 24 wherein said wordline voltage supply circuit for providing said predetermined high voltage comprises an external high voltage supply.

30. A method of controlling the voltage applied to a plurality of wordlines in a memory device during test mode, comprising the steps of:

applying a first predetermined voltage that is generated by at least one wordline voltage supply circuit to at least one wordline for a first predetermined amount of time;

applying a second predetermined voltage that is generated by said at least one voltage supply circuit to said wordline for a second predetermined amount of time; and applying a predetermined high voltage that is generated by said at least one voltage supply circuit to said wordline for a third predetermined amount of time, wherein said wordline voltage supply circuit for providing said predetermined high voltage comprises an external high voltage supply.

31. The method of claim 30 wherein said first predetermined voltage is about zero volts.

32. The method of claim 30 wherein said second predetermined voltage is about 3.3 volts.

33. The method of claim 30 wherein said predetermined high voltage is at least 7 volts.

34. The method of claim 30 wherein said first predetermined amount of time is the amount of time required for said first predetermined voltage to be applied to said at least one wordline.

* * * * *